United States Patent [19]

Roberts

[11] 4,006,410
[45] Feb. 1, 1977

[54] CORONA DISCHARGE DETECTION SYSTEM FOR DETECTING THE PRESENCE OF ANY CORONA DISCHARGE IN AN ELECTRICAL SYSTEM

[75] Inventor: Danvern R. Roberts, El Paso, Tex.

[73] Assignee: Lee A. Chagra, El Paso, Tex. ; a part interest

[22] Filed: Dec. 19, 1975

[21] Appl. No.: 642,550

[52] U.S. Cl. .................................. 324/52; 324/54; 324/72; 324/113; 360/6
[51] Int. Cl.² ................... G01R 31/08; G01R 13/04
[58] Field of Search ............... 324/52, 54, 72, 103, 324/113; 360/6

[56] References Cited

OTHER PUBLICATIONS

Toole et al., *Airborne Scanner Detects Transmission Line Problems*, Transmission and Distribution, vol. 24, No. 4, Apr. 1972, pp. 48, 49.

*Primary Examiner*—Gerard R. Strecker
*Attorney, Agent, or Firm*—D. Paul Weaver

[57] ABSTRACT

A corona discharge detection system is disclosed. The detection system is composed of two basic sub-systems, a detection record system and a detection playback. The detection record system detects a corona discharge, visually displays the discharge on a cathode ray tube and records the corona discharge video data along with voice and geographic data. The playback system processes the recorded information to provide a playback of the recorded data. The playback system includes an audio system that reproduces the stored audio information and a strip chart recorder that reproduces the corona video data and the geographic data to provide a visual record of this data.

10 Claims, 2 Drawing Figures

CORONA DISCHARGE DETECTION SYSTEM FOR DETECTING THE PRESENCE OF ANY CORONA DISCHARGE IN AN ELECTRICAL SYSTEM

BACKGROUND OF THE INVENTION

This invention relates to the detection of corona discharges; and more particularly, to a system for detecting corona discharges, recording data relating to the detected discharges and the playing back of the recorded data.

When corona discharge occurs in any electrical system, the system is generally damaged such that further deterioration of the system is generally inevitable. If the operator of an electrical system is aware that a corona discharge has taken place somewhere in the electrical system and is aware of the exact location of any such a discharge, he can make a physical inspection of the system at that point to determine the extent of any damage caused by the corona discharge and make any necessary repairs. If no repairs are deemed necessary at the time, this area of the system would be closely monitored for further deterioration so that repairs can be made before a failure occurs. Thus, knowledge of corona discharges and knowledge of the location of such discharges in an electrical system enables an operator of the system to take corrective action to prevent failure of the electrical system due to damage caused by corona discharge. Generally, one wants to avoid unexpected failures in any electrical system, particularly in systems such as electrical utility power systems. High voltage transmission lines of utility power systems are often subjected to corona discharges and failure of the transmission line system can and often does occur due to corona discharge damage. Obviously, unexpected failures must be guarded against in an electrical power transmission system.

Various systems have been developed for detecting corona discharge in an electrical system. However, a need exists in the art for a detection system that not only detects corona discharges with a high degree of accuracy but also pinpoints the location of the discharge and provides a record of both the occurrence and the location of the discharge. This invention meets this need in that the system of this invention detects corona discharge with a high degree of accuracy in the presence of other disturbances, records corona discharge data along with audio and geographic data and provides a playback system to playback the recorded data.

SUMMARY OF THE INVENTION

This invention provides a highly sensitive corona discharge detection system. The system detects the frequency components of the corona discharge in such a manner that the energy associated with the corona discharge appears to come from a point source. This is accomplished by processing only those frequency components (the high frequency components) of the frequency spectrum of a corona discharge that do not propagate along the wires associated with the electrical system being inspected for corona discharge. Since the energy of the corona discharge appears to come from a point source, the precise location of the discharge can be ascertained.

The system of this invention not only detects a corona discharge and pinpoints its location in the electrical system but also, after the processing, displays the discharge on a cathode ray tube and records the video corona discharge data along with voice information and geographic data on a magnetic tape system so that the data gathered can be studied and analyzed after the detection investigation has been completed. The overall system of the invention includes playback apparatus and circuitry for playingback the data recorded by the detection and record apparatus and circuitry.

The corona discharge detection system of this invention has general utility in the field of corona discharge detection. However, the invention is particularly well suited for the detection of corona discharges on high tension (cross country) transmission lines and substations. The sensitivity of the system is such that corona discharges in transmission lines can be detected from an aircraft flying over the transmission lines.

BRIEF DESCRIPTION OF THE DRAWING

A complete understanding of the construction and operation of the invention can be obtained from the following detailed description when read in conjunction with the annexed drawing in which.

DETAILED DESCRIPTION OF THE INVENTION

Figure 1:
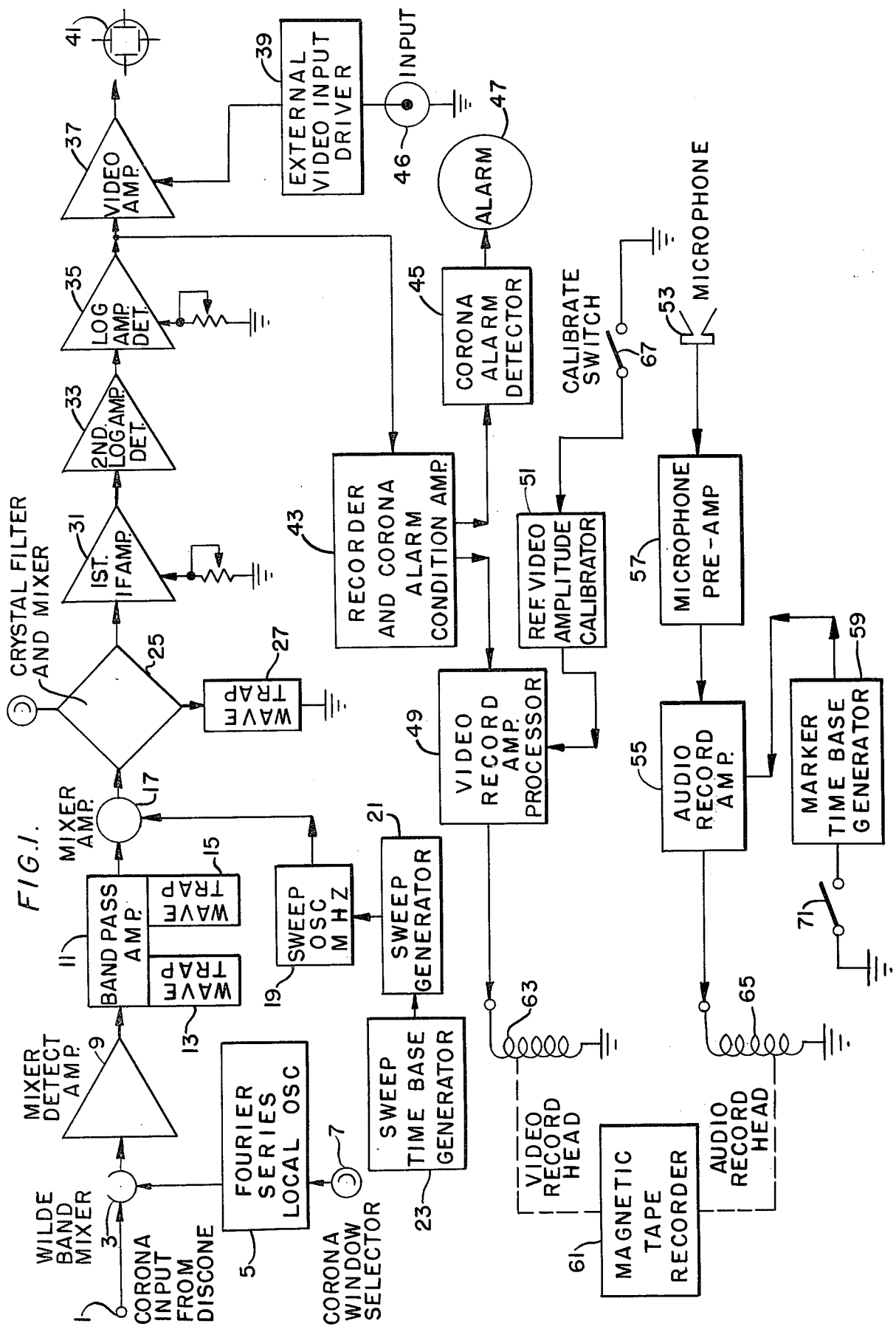
FIG. 1 shows a preferred embodiment of the detection and record sub-system of the invention and FIG. 2 shows a preferred embodiment of the playback sub-system of the invention.

Referring first to FIG. 1, this Figure shows a preferred embodiment of the detection and record sub-system of the corona discharge detection system of the invention. The electrical system that is being investigated for corona discharges is scanned by a pickup element 1 which may be a discone antenna or for confined areas, a detection probe. Pickup element 1 is external to the balance of the system.

The pickup element 1 is coupled to one of two inputs of a wide band mixer 3. The other of the two inputs of wide band mixer 3 is connected to a Fourier series local oscillator 5. A corona window selector 7 is connected to Fourier series local oscillator 5.

The output of wide band mixer 3 is connected to the input of a mixer detector amplifier 9. The output of mixer detector amplifier 9 is connected to the input of the band pass amplifier 11 which has a pair of wave traps 13 and 15 associated therewith. The output of band pass amplifier 11 is connected to one of two inputs of the mixer amplifier 17. The other input of the two inputs of mixer amplifier 17 is connected to the output sweep oscillator 19. A sweep generator is connected to sweep oscillator 19 and a sweep time base generator 23 is connected to sweep generator 21.

The output of mixer amplifier 17 is connected to one of two inputs of the crystal filter and mixer 25 which has a wave trap 27 associated therewith. The other of the two inputs of crystal filter and mixer 25 is connected to the output of the oscillator 29.

The output of crystal filter and mixer 25 is connected to the amplifier 31 and the output of amplifier 31 is connected to the input of amplifier 33 which may be a single stage amplifier but preferably is a multi-stage amplifier. The output of amplifier 33 is connected to the input of the log amplifier detector 35. The output of log amplifier detector 35 is connected to one of the two inputs of the video amplifier 37. The other of the two inputs of video amplifier 37 is connected to the output of the external video input driver 39. The output of video amplifier 37 is connected to a cathode ray tube display 41.

In addition to being connected to the input of video amplifier 37, the output of log amplifier detector 35 is also connected to the input of recorder and corona alarm condition amplifier 43. Recorder and corona alarm condition amplifier 43 has a first output connected to the input of corona alarm detector 45 and a second output connected to one input of the video record amplifier processor 49. The other input of video record amplifier processor 49 is connected to the output reference video amplitude calibrator 51. A calibrate switch 67 is connected to reference video amplitude calibrator 51. The output of corona alarm detector 45 is connected to an alarm 47 which may be an audio alarm or a visual alarm.

The output of video record processor 49 is connected to the video record head of a two track magnetic tape recorder 61. A microphone 53 is connected to the input of microphone preamplifier 57. The output of microphone preamplifier is connected to one of two inputs of audio record amplifier 55. The other of the two inputs of audio record amplifier 55 is connected to the output of marker time base generator 59. A count switch is connected to pole marker time base generator 59. The output of audio record amplifier 55 is connected to the audio record head of two track magnetic tape recorder 61.

The system of FIG. 1 just described detects corona discharges; processes the detected discharges, displays the discharges on a cathode ray tube; records the video corona discharge data along with audio logging information and geographic data.

The operation of the circuitry of FIG. 1 can best be described with reference to frequency components. The frequencies associated with corona discharge can be generalized as having the following distribution: Where $G(w)$ is the frequency spectrum:

$$G(w) = \frac{2E}{\pi} \int_0^\infty \frac{\sin \frac{wt}{2} \cos wt\, dw}{w}$$

This frequency spectrum is defined by the foregoing Fourier integral. From this integral it is apparent that $G(w)$ has infinite frequency components. The circuitry of FIG. 1 basically detects these frequency components in such a manner that the energy associated with a corona discharge appears to come from a point source. This is accomplished by looking at components of $G(w)$ that do not propagate along the wire of the electrical device or system under investigation. This is basically accomplished by looking at the high frequency components of $G(w)$.

While the high frequency components of $G(w)$ will not propagate along the wires of the device of system which emits a corona discharge because of the series inductance and shunt capacitance which tend to attenuate $G(w)$, there is a possible tuned circuit which may exist at some $G^1(w)$ at the source of corona discharge, such that no energy is detectable because of shorting effects. Thus, the problem exists as to what $G(w)$'s to look at to avoid this possibility. The solution of the problem is to select another infinite series of $G(w)$ which may be conveniently called $G''(w)$ such that an infinite number of high frequency components of $G(w)$ can be looked at simultaneously. The probability of selecting a series of $G''(w)$, the energy distribution of which is not detectable is nil. The circuitry of FIG. 1 selects a series of $G''(w)$ received by pickup device 1 which are in the universe of $G(w)$. However, the sensitivity of this circuit is such that only one component of $G''(w)$ that is in the universe of $G(w)$ need be present.

The expression of $G''(w)$ which can be selected by the circuitry of FIG. 1 is defined as follows:

$$G''(w) = \sum_{n=100 \times 10^6}^{n=200 \times 10^6} \sum_{i=1}^{i=\infty} i \left[ n + \sum_{j=0}^{j=6 \times 10^6} (32 \times 10^6 + j) \right] H_z$$

Basically, the $n$ terms of the foregoing expression for $G''(w)$ are selected by corona window selector 7 which is variable. Any valves of $n$ can be selected and various valves of $n$ are selected with corona window selector 7 so as to pick valves of $n$ such that no outside interference signal (i.e., radio signals) will appear in the $G'\lambda '(w)$ series. With interference free $G''(w)$ series, the overall sensitivity of the system is increased.

The $j$ terms of the $G''(w)$ series are generated by sweep time base generator 23, sweep generator 21 and sweep oscillator 19 and $i$ terms are automatically generated by Fourier series local oscillator 5.

The corona information is compressed into a 6 mHz band width by mixer detector amplifier 9 and band pass amplifier 11. The output of sweep oscillator is mixed with the output of band pass amplifier 11. The difference of these two products is taken in mixer amplifier 17 and is passed through a band pass filter which consists of mixer amplifier 17 and crystal filter and mixer 25, the amplifier portion of mixer amplifier 17 being a band pass amplifier. This information is shaped into a high resolution response by the crystal filter of crystal filter and mixer 25 along with wave trap 27. The $G''(w)$ is further compressed by the mixer action of the mixer portion of the crystal filter and mixer 25 along with wave trap 27. This mixer mixes the output of mixer amplifier 17 with the output of oscillator 29.

The compressed $G''(w)$ output from crystal filter and mixer 25 is amplified by approximately 110dB by amplifier 31, amplifier 33 and log amplifier detector 35. The video output from log amplifier detector 35 is further amplified by video amplifier 37. The output of video amplifier 37 is used to drive cathode ray tube display 41 which provides a visual display of any detected corona discharge.

In order to provide a reproducible stored record of any detected corona discharges, the output of log amplifier detector 35 is also coupled to the input of recorder and corona alarm condition amplifier 49. One output of recorder and corona alarm condition amplifier 43 is connected to the input of video record amplifier processor 49 which processes the corona discharge video data from log amplifier detector 35 and applies this processed video data to the video record head 63 of two track magnetic tape recorder 61. Reference video amplitude calibrator 51 provides a reference video amplitude signal to video record amplifier processor when activated by switch 67. This reference signal is used to normalize all tape records so that a tape from any corona discharge detection and record unit of FIG. 1 is normalized with a tape record from any other corona discharge detection and record unit of FIG. 1.

The second output of recorder and corona alarm condition amplifier 43 is connected to the input of corona alarm detector 45 which merely detects the presence of an output signal from recorder and corona alarm condition amplifier and in response to the detection of any such signals activates alarm 47. Alarm 47 may be a visual alarm such as a warning light or may be an audio alarm such as a buzzer, bell, or the like and is provided to alert the operator to the fact that a corona discharge has been detected.

When the operator has been alerted to the fact that a corona discharge has been detected, he may wish to add some voice information such as logging information to the corona discharge data being recorded. This is accomplished by means of microphone 53, microphone preamplifier 57 and audio record amplifier 55. The output of audio record amplifier 55 is coupled to audio record head 65 of two track magnetic tape recorder 61. Thus, this audio information is recorded on one of the two tracks of the two track magnetic tape of magnetic tape recorder 61 in sync with the video corona discharge data that is being recorded on the other of the two tracks.

Along with the audio logging information, the circuit of FIG. 1 provides for the recording of geographic data. This geographic data indicates the geographic location of each corona discharge detected in a given electrical system being investigated. The geographic data is added by means of marker time base generator 59 which applies an audio tone to audio record head 65 through audio record amplifier 55 each time switch 71 is closed. Thus, this audio tone which represents geographic data and the voice logging data are both recorded on the same track of the two track tape of magnetic tape recorder 61. The geographic data provided by marker time base generator 59 locates the place in the electrical system where each detected corona discharge took place. For example, assume that the detection and recorded system of FIG. 1 is being used to detect any corona discharges in a long electrical transmission line, in this case marker time base generator 59 pole or tower marker time base generator and switch 71 would be a pole count switch. Thus, from the tones recorded on the magnetic tape one can determine that a particular corona discharge was detected, for example, after the fourth pole or tower but before the fifth pole or tower. In other words, a pole count of the poles in the system provides the geographic location of a corona discharge.

In summary, the circuitry of FIG. 1, detects corona discharges, processes these detected corona discharges to provide a visual display on a cathode ray tube display and stores the video corona discharge data on a magnetic tape. In addition, the system provides an alarm that indicates that a corona discharge has been detected and records voice logging information and geographic data. After an electrical system has been checked for corona discharges, the recorded information about any discharges can be played back by the playback portion of the invention which is shown in FIG. 2.

Figure 2:
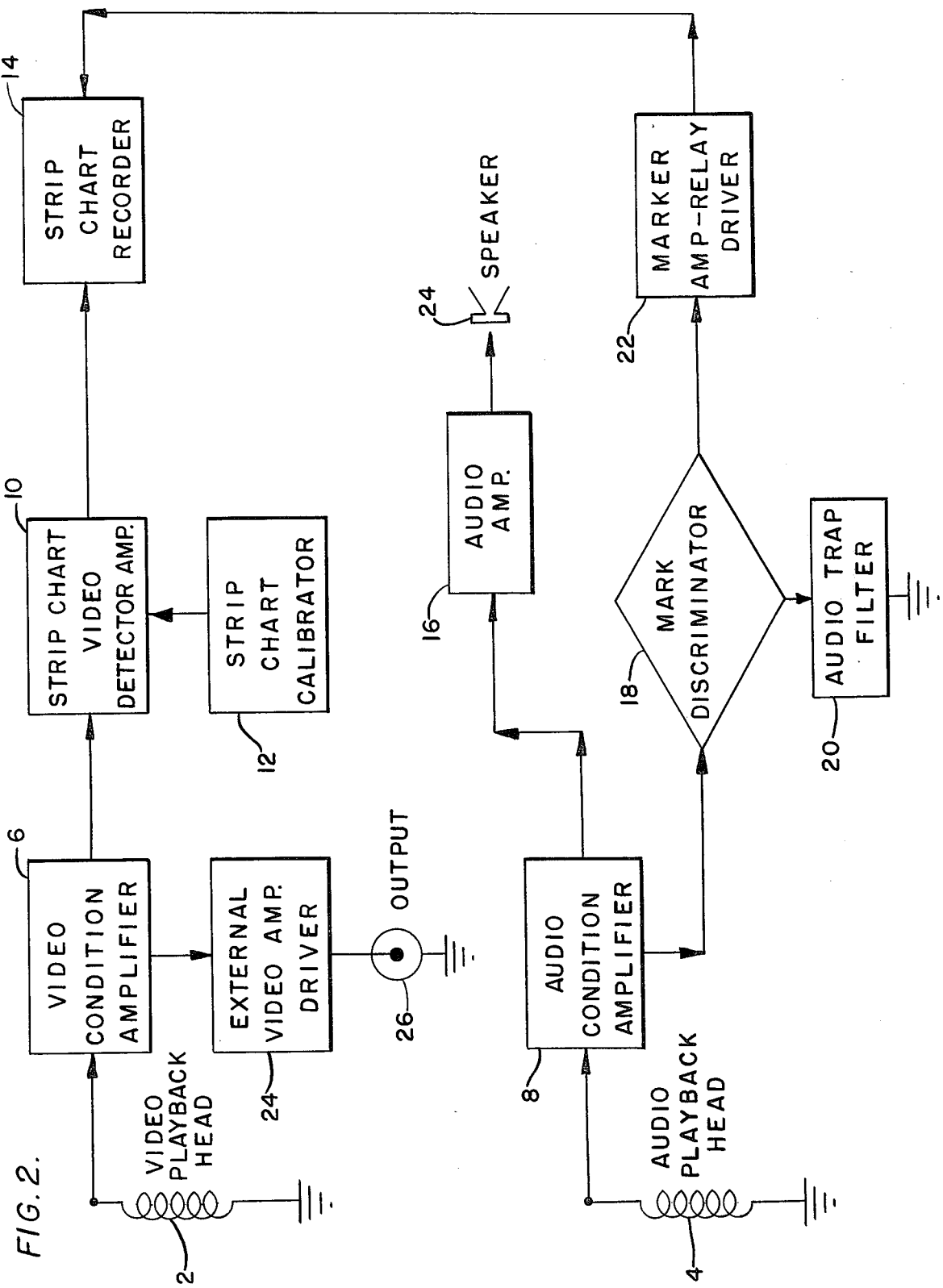

As shown in FIG. 2, the playback portion of the invention includes a video playback head 2 and an audio playback head 4. Video playback head 2 and audio playback head 4 may conveniently be playback heads of a simple conventional magnetic tape player (not shown) or these heads could be part of magnetic tape recorder 61. If playback heads 2 and 4 are the heads of a simple magnetic tape playback device, then a tape containing information recorded by the circuitry of FIG. 1 would be inserted into this playback device to playback the tape and magnetic tape recorder 61 would be just a recorder system capable of performing only the record function and conveniently the erase function. If on the other hand, playback heads 2 and 4 are part of magnetic tape recorder 61, magnetic tape recorder 61 will be conventional two track magnetic tape device capable of performing the record function, the playback function and usually the erase function. Under these conditions, magnetic tape recorder 61 would be disconnected from the circuitry of FIG. 1 and connected to the circuitry of FIG. 2 such that the video playback output would be connected to the input of video condition amplifier 6 and the audio playback output would be connected to the input of audio condition amplifier 8. While magnetic tape recorder 61 could serve to provide both the record and playback functions, it is preferable to have magnetic tape recorder 61 provide only the record function with a separate playback system including the tape transports and the like being provided with the playback system of FIG. 2. By providing separate record and playback devices, one need only remove the magnetic tape from magnetic tape recorder 61 and transport the tape to the playback system rather than transporting the entire recorder. Of course, two separate full function playback-record devices could be provided but this would add on additional unnecessary expense.

In any event, the output video playback head 2 is coupled to video condition amplifier 6 whose output is coupled to the signal input of strip chart video detector amplifier 10. Strip chart video detector amplifier 10 also has a calibration input connected to the output of strip chart calibrator 12. The output of strip chart video detector amplifier 10 is connected to the pen No.1 input of strip chart recorder 14. Strip chart recorder 14 is a two pen strip chart recorder having a pen No.1 input and a pen No.2 input.

The output from audio playback head 4 is coupled to the input of audio condition amplifier 8. Audio condition amplifier 8 has a first output connected to the input of audio amplifier 16 and a second output connected to the input of mark discriminator 18. The output of audio amplifier 16 is connected to speaker 24. The output of mark discriminator 18 is connected to the input of marker amplifier relay driver 22. An audio trap filter 20 is connected to mark discriminator 18. The output of marker amplifier relay driver 22 is connected to the input pen No.2 input of strip chart recorder 14.

The input of an external video amplifier 24 is connected to a second output of video condition amplifier 6 and the output of external video amplifier driver 24 is connected to an output terminal or plug 26. External video amplifier driver 24 and output 26 are, as will be described later, used in conjunction with external video input driver 39 and the input terminal on plug 43.

After an electrical system has been investigated for corona discharges by the circuitry of FIG. 1, the magnetic tape is removed from the system of FIG. 1 and placed in the system of FIG. 2 to playback the information recorded during the corona discharge investigation. The video corona discharge data recorded on one of the two tracks of the magnetic tape is detected by video playback head 2 and these signals are coupled to the input of video condition amplifier 6. The amplified signals from video condition amplifier 6 are applied to the input of strip chart video detector amplifier 10. The corona discharge data signals from strip chart video detector amplifier 10 are applied to pen No.1 input of strip chart recorder 14 to drive the number one pen of strip chart recorder 14. Strip chart recorder 14 therefore provides a printed permanent record of the corona discharge data. At the same time, the voice logging information and geographic data recorded on the other of the two tracks of the magnetic tape is detected by audio playback head 4 and these signals are applied to the input of audio condition amplifier 8. The output signals from audio condition amplifier 8 are applied to the input of audio amplifier 16 and to the input of mark discriminator 18. The output of audio amplifier 16 is applied to speaker 24 to broadcast the voice logging information.

Audio trap filter 20 passes all of the audio signals applied to the input of mark discriminator 18 except the geographic data tone signals (the marker signals) to ground so that only the geographic data signals appear on the output of mark discriminator 18. These geographic data signals from mark discriminator 18 are applied to the input of marker amplifier relay driver. The geographic data signals from marker amplifier relay driver 22 are applied to pen No.2 input of strip chart recorder 14. Thus, a printed record of the geographic data is provided in sync with the printed record of the corona discharge data. The magnetic tape can then be removed from the playback system and erased or, if desired, the tape can be stored with the information remaining on the tape for future study.

If desired, the corona discharge data can be observed on the cathode ray tube during playback by means of output 26 in FIG. 2 and input 46 of FIG. 1. Output 26 and input 46 are preferably both plugs so that a cord with jacks at each end can be used to connect output 26 to input 46. When output 26 is so connected to input 46, the corona discharge data signals played back are applied to cathode ray tube display 41 thereby providing a visual display of these signals.

In memory, the circuitry of FIG. 1 detects corona discharges, processes the detected discharges, records the discharge data signals on one of two tracks of a magnetic tape, provides geographic data and voice logging data that are recorded on the other track of the two track magnetic tape, provides an alarm indication of the fact that a corona discharge has been detected and displays the corona discharge data on a cathode ray tube display. The circuitry of FIG. 1 is highly sensitive and is essentially interference free.

After the data has been gathered and recorded on the magnetic tape, it is playbacked by the playback circuitry of FIG. 2. The playback circuitry of FIG. 2 detects the information stored on the two tracks of the magnetic tape, processes the corona discharge data in a first channel and records this information on a strip chart recorder to provide a permanent printed record of the data, processes the voice logging and geographic data in a second channel which separates the voice logging data from the geographic data, and applies the voice logging data to a speaker and the geographic data to the strip chart recorder in sync with the corona discharge data thereby providing printed record of the geographic data along with the printed record of the corona discharge data. In addition, during playback the corona discharge data can be displayed on the cathode ray tube display of the detection and record circuit.

While the invention has been described with reference to the specific embodiment of the detect and record system shown in FIG. 1 and with reference to the specific embodiment of the playback system shown in FIG. 2, it will be apparent to those skilled in the art that various changes and modifications can be made to these specific embodiments without departing from the spirit and scope of the invention as defined in the claims.

I claim:

1. A corona discharge detection system comprising:
  detection means for detecting corona discharges in an electrical system;
  selection means coupled to said detection means for selecting only specified frequency components of any detected corona discharges;
  processing means coupled to said selection means for processing said selected frequency components to produce video corona discharge data for each detected corona discharge;
  recording means having a first track and a second track.
  recorder and corona alarm detection condition amplifier means coupled to the output of said processing means;
  corona alarm means coupled to said recorder and corona alarm condition amplifier means for producing an alarm indication in response to any video corona discharge data from said recorder and corona alarm condition amplifier means;
  a video record amplifier processor for amplifying and processing any video corona discharge data from said recorder and corona alarm condition amplifier means;
  means coupled to the output of said video record amplifier processor for recording any video corona discharge data output from said video record amplifier processor on said first track of said recording means;
  audio record amplifier means having a first input, a second input and an output;
  means to apply voice frequency logging information signals to said first input of said audio record amplifier means;
  a marker time base generator coupled to said second input of said audio record amplifier means, said marker time base generator providing geographic data signals indicative of the geographic location of any detected corona discharges; and
  means coupled to said output of said audio record amplifier means to record said voice frequency logging information signals and said geographic data signals from said marker and time base generator on said second track of said recording means.

2. A corona discharge detection system as defined in claim 1 wherein said selected frequency components of said detected corona discharges are the high frequency components and wherein said selection means for selecting only said specified frequency components includes a corona window selector.

3. A corona discharge detection system as defined in claim 2 wherein said recording means is a magnetic tape recorder having a video record head, an audio record head and a magnetic tape having said first track and said second track.

4. A corona discharge detector system as defined in claim 3 wherein said means for recording said video corona discharge data on said first track includes said video record head and said means for recording said voice logging information and said geographic data on said second track includes said audio record head.

5. A corona discharge system as defined in claim 4 wherein said voice logging information input means comprises a microphone, and a preamplifier having its input coupled to said microphone and its output coupled to said audio record.

6. A corona discharge detection system as defined in claim 5 wherein a cathode ray tube display is coupled to said processing means.

7. A corona discharge detection system as defined in claim 6 further including playback means for playing back said corona discharge data recorded on said first track and said voice logging information and said geographic data recorded on said second track.

8. A corona detection system as defined in claim 6 wherein said playback means comprises:
- a video playback head for detecting said video corona discharge data recorded on said first track;
- a video condition amplifier coupled to the output of video playback head;
- a strip chart video detector amplifier coupled to the output of said video condition amplifier;
- a strip chart recorder having a first pen input and a second pen input;
- means to couple the output of said strip chart video detector amplifier to said first pen input of said strip chart recorder;
- an audio playback head;
- an audio condition amplifier having an input coupled to said audio playback head and having a first output and a second output;
- an audio amplifier coupled to said first output of said audio condition amplifier;
- a speaker coupled to said audio amplifier;
- a mark discriminator coupled to said second output of said audio condition amplifier;
- wave trap filter means for filtering out all but said geographic data signals from the output of said mark discriminator;
- a marker amplifier relay driver coupled to the output of said mark discriminator to receive said geographic data signals from said mark discriminator; and
- means to couple the output of said marker amplifier relay driver to said record pen input of said strip chart recorder.

9. A corona discharge detector system as defined in claim 8 wherein said detection means for detecting corona discharges in an electrical system comprises a discone antenna.

10. A corona discharge detection system as defined in claim 8 wherein said detection means for detecting corona discharges in an electrical system comprises a probe.

* * * * *